United States Patent [19]

Schanzer et al.

[11] 4,281,400
[45] Jul. 28, 1981

[54] CIRCUIT FOR REDUCING THE LOADING EFFECT OF AN INSULATED-GATE FIELD-EFFECT TRANSISTOR (IGFET) ON A SIGNAL SOURCE

[75] Inventors: Henry I. Schanzer, Edison; Roger G. Stewart, Neshanic Station, both of N.J.

[73] Assignee: RCA Corporation, New York, N.Y.

[21] Appl. No.: 108,222

[22] Filed: Dec. 28, 1979

[51] Int. Cl.³ ............................ G11C 7/00; G11C 11/40
[52] U.S. Cl. ................................. 365/203; 307/DIG. 1; 365/156; 365/190
[58] Field of Search .............. 365/154, 156, 174, 189, 365/203, 190; 307/DIG. 1, 238

[56] References Cited

U.S. PATENT DOCUMENTS

| 3,617,775 | 11/1971 | Allen | 365/203 |
| 3,618,053 | 11/1971 | Hudson et al. | 365/203 |
| 4,189,782 | 2/1980 | Dingwall | 365/203 |

OTHER PUBLICATIONS

Chu et al., Writing FET Memory Cells with Pre-charged Bit Line, IBM Tech. Disc. Bul., vol. 18, No. 6, 11/75, pp. 1843–1844.

*Primary Examiner*—Stuart N. Hecker
*Attorney, Agent, or Firm*—Samuel Cohen; Henry I. Schanzer

[57] ABSTRACT

A charge is placed on the floating substrate of an insulated-gate field-effect transistor IGFET by applying, to the source of the IGFET, a signal making a first transition between first ($V_1$) and second ($V_2$) voltages and a second transition between the second voltage and a third voltage ($V_3$) which is intermediate $V_1$ and $V_2$. The first transition is of a polarity and magnitude to forward bias the source-to-substrate junction of the IGFET and establishes a first level ($L_1$) at the substrate region close to said second voltage. The second transition causes the source potential to go to $V_3$ but the source-to-substrate junction is reverse biased and the substrate potential remains at a level ($L_2$) which is intermediate $L_1$ and $V_3$. Consequently, the source to substrate junction remains isolated for values of signals applied to the source in the range between $V_1$ and $L_2$.

9 Claims, 9 Drawing Figures

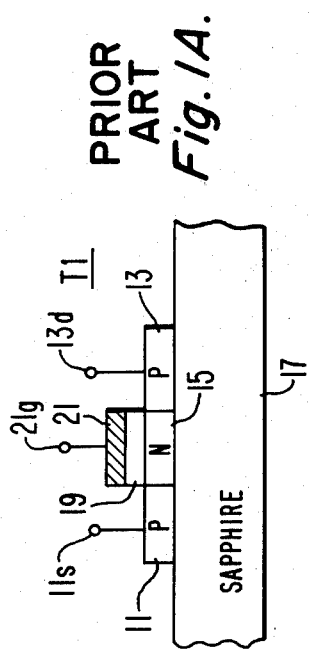
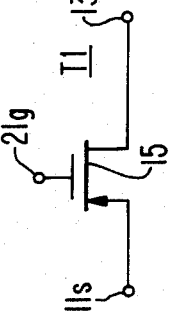
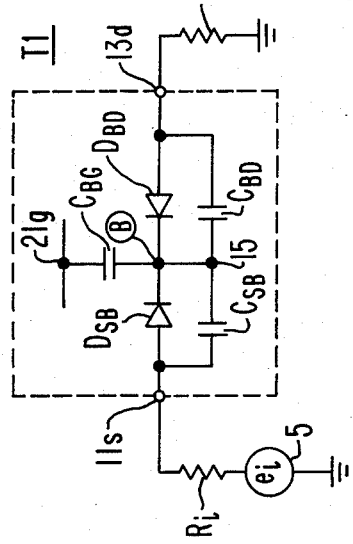
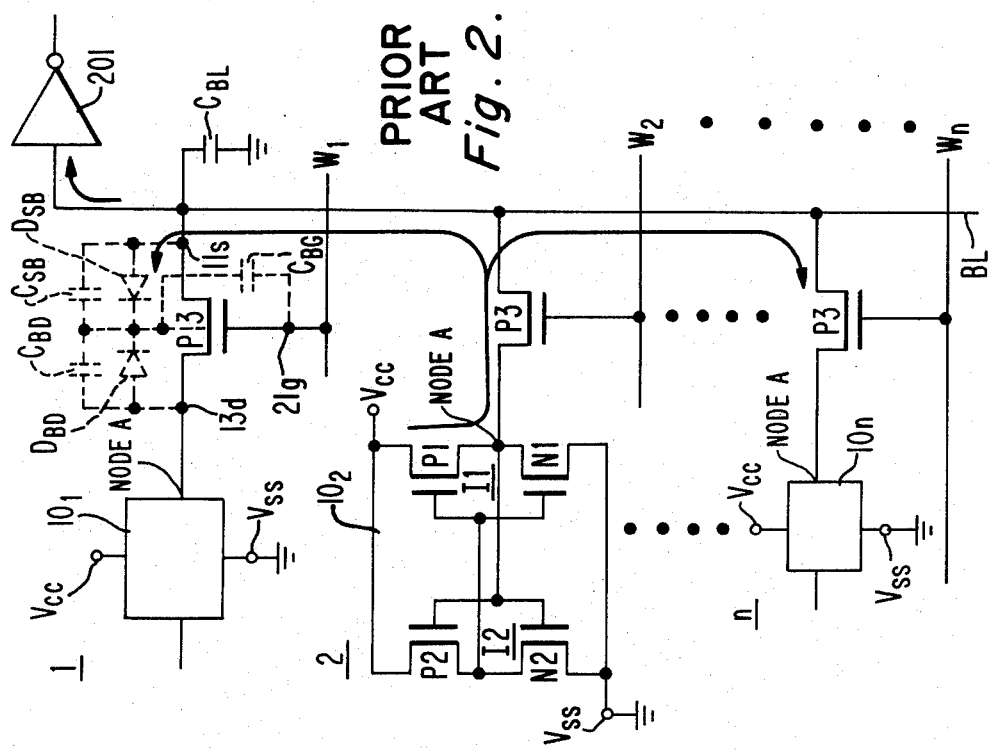

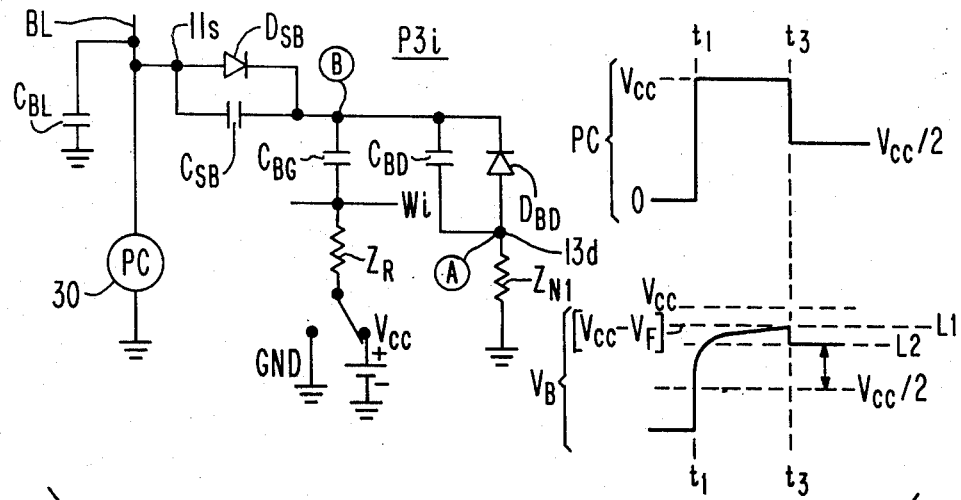
Fig.6.
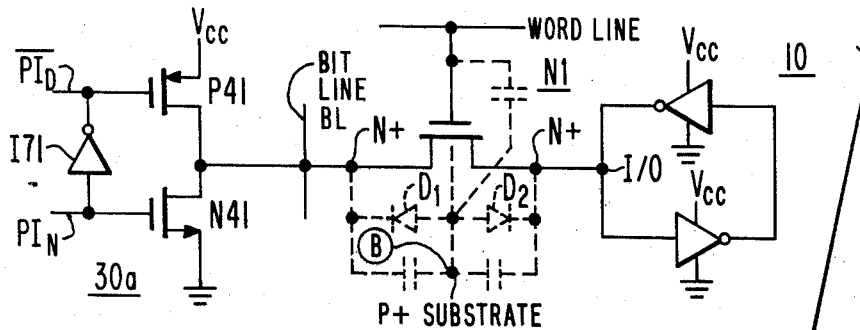
7A. WORD LINE
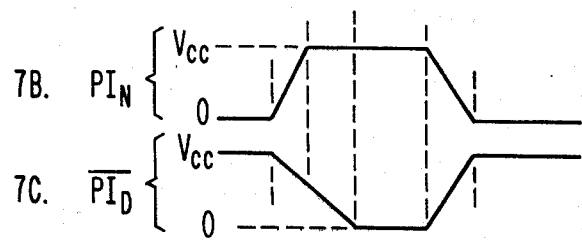
7B. $PI_N$
7C. $\overline{PI_D}$
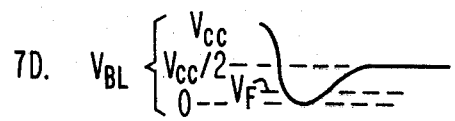
7D. $V_{BL}$
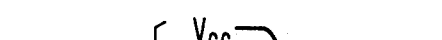
7E. $V_B$
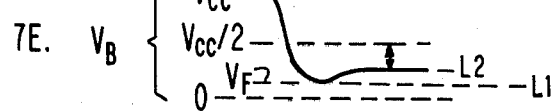
Fig.7.

CIRCUIT FOR REDUCING THE LOADING EFFECT OF AN INSULATED-GATE FIELD-EFFECT TRANSISTOR (IGFET) ON A SIGNAL SOURCE

This invention relates to insulated-gate field-effect transistors (IGFETs) having an electrically floating substrate and, in particular, to a circuit for reducing the loading effect of such devices on a signal source.

In the accompanying drawings like reference characters denote like components; and FIG. 1A is a cross sectional view of a known IGFET formed on a sapphire substrate;

FIG. 1B is a schematic representation of the circuit of FIG. 1A;

FIG. 1C is a schematic representation of parasitic elements associated with the transistor of FIGS. 1A and 1B in the OFF condition;

FIG. 2 is a schematic representation of a prior art random access memory (RAM):

FIG. 6 is a simplified equivalent circuit of a "pass" transistor being precharged; and FIG. 7 is a schematic representation of another RAM array embodying the invention.

Figure 3:
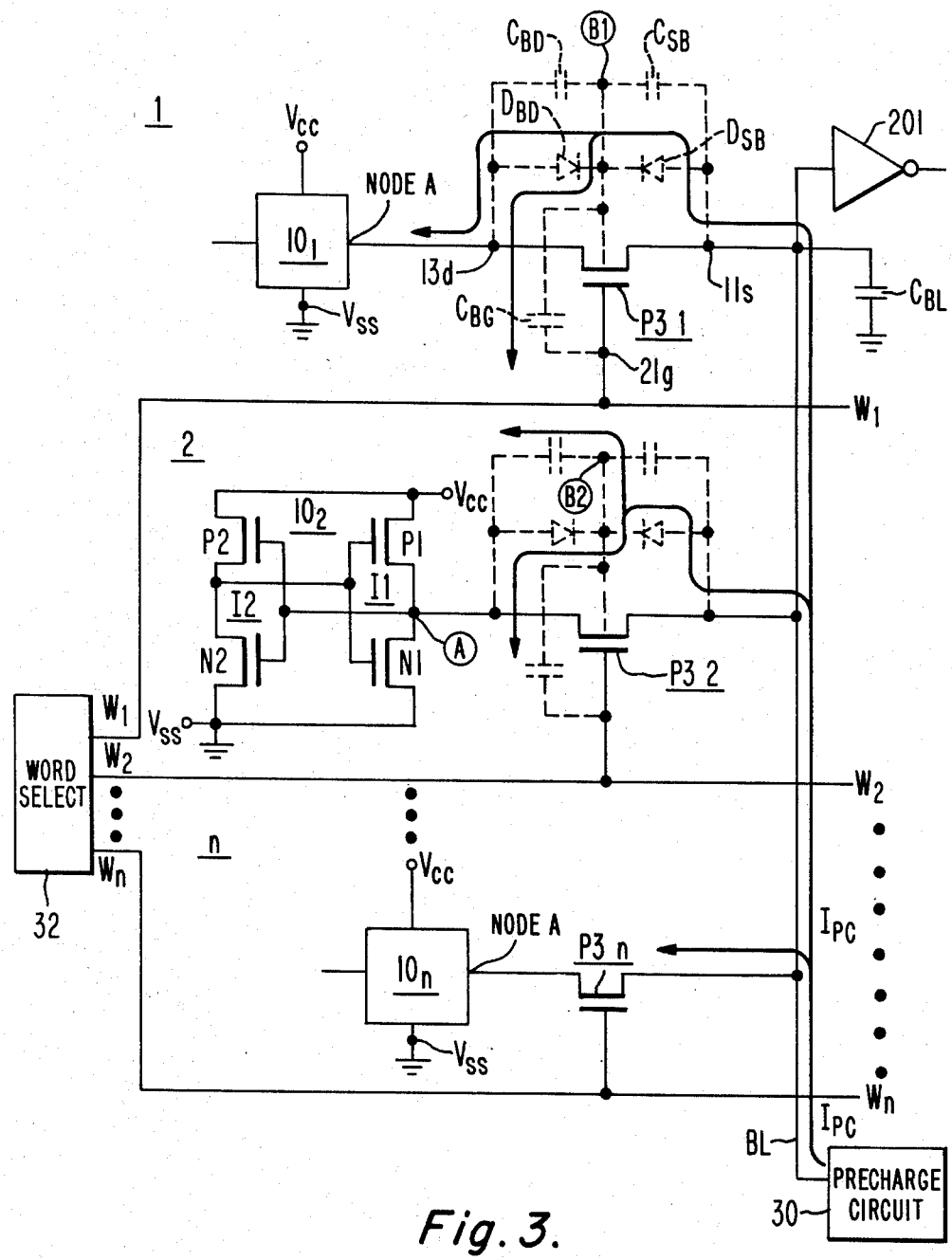
FIG. 3 is a schematic representation of a RAM array embodying the invention.

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor," when used without limitation in the appended claims, is used in a generic sense.

In the FIGURES, enhancement type IGFETs of P conductivity type are identified by the letter P followed by a particular reference numeral; and enhancement type IGFETs of N-conductivity type are identified by the letter N followed by a particular reference numeral. The characteristics of IGFETs are well knwon and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude then a given value, which is defined as the threshold voltage ($V_T$) of the transistor. To turn on a P type transistor its gate voltage ($V_G$) has to be more negative than its source voltage ($V_S$) by at least $V_T$. To turn on an N-type transistor its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e. the source and drain are interchangeable.

In the discussion to follow, a potential at, or near ground is arbitrarily defined as a logic "0" or "low" condition and any potential at or near $+V_{CC}$ or $+V$ volts is arbitrarily defined as a logic "1" or "high" condition.

A problem associated with IGFETs having a floating substrate, is best explained by first referring to FIGS. 1A, 1B and 1C. FIG. 1A shows the cross section of a P-channel IGFET (T1) formed on a sapphire (insulator) base 17. The IGFET includes a source region 11 and a drain region 13 of P-conductivity type separated by a substrate region 15 of N-conductivity type. In the discussion to follow, the term "substrate" refers to the region between the source and drain of a transistor. There is no fixed potential directly applied to the substrate 15. This is typical of an IGFET formed on an insulator (sapphire) base. The substrate 15 can, therefore, float and assume a wide range of values depending on the potentials applied to the source or drain regions. When T1 is turned on, a conduction channel (inversion layer) is formed along the top surface of N region 15 between the source and drain regions. The portion of N region 15 underlying the conduction channel then acts as the local substrate of the transistor. When T1 is turned off, all of region 15 acts as the substrate of transistor T1. Overlying region 15 is an insulator (e.g. oxide) layer 19 over which is formed a gate electrode 21 of conductive material. The gate, source and drain regions are, respectively, accessed by means of gate electrode 21g, source electrode 11S and drain electrode 13d. FIG. 1B schematically illustrates the transistor whose structural details are shown in FIG. 1A.

When transistor T1 is operated as a turned off transmission gate, it may be represented as shown in FIG. 1C. The source-to-substrate junction of T1 forms a PN diode ($D_{SB}$) poled to conduct current from the source node 11S into the substrate (B) region 15 and the drain-to-substrate junction forms a PN diode ($D_{BD}$) poled to conduct current from the drain node 13d into substrate region 15. Associated with diodes $D_{SB}$ and $D_{BD}$ are capacitances $C_{SB}$ and $C_{BD}$, respectively. Capacitance ($C_{BG}$) represents the capacitance between the substrate region 15 and the gate 21 of T1. In practice $C_{BG}$ is considerably larger than the diode capacitance. Typically, $C_{BG}$ may be on the order of 0.01 pf (picofarad) and $C_{BD}$ or $C_{SB}$ may be on the order 0.002 pf.

The parasitic elements cause a serious problem which is best described by assuming the substrate to be at, or close to, 0 volts. This condition exists if, when T1 was last turned on, a zero voltage level signal was passed via its conduction path and T1 was then (and remains) turned off. To complete the explanation, assume that a load $R_L$ (which may be a passive or an active load) is connected between drain electrode 13d and ground and that a signal source 5 with a source impedance $R_i$ is connected to source electrode 11S. Assume now that a signal going positive from 0 volts to $V_{CC}$ volts is applied to source electrode 11S with T1 still OFF. Diode $D_{SB}$ is then forward biased (shorting out $C_{SB}$) and provides a low impedance path between the signal source 5 and substrate 15 at which is present the parasitic capacitances $C_{BD}$ and $C_{BG}$. Although $C_{BD}$ and $C_{BG}$ are very small, they represent an alternating current (A.C.) impedance between region 15 and ground, loading down the signal source 5 which must supply a displacement current until region 15 is charged to $V_{CC}$ volts, [actually, $V_{CC}-V_F$, where $V_F$ is the forward voltage drop of diode $D_{SB}$ where $V_F$ is typically 0.6 volts]. Thus, although T1 is turned off, $C_{BD}$ and $C_{BG}$ load down positive going signals which are coupled from the source to the substrate.

Therefore, a problem exists with transistors (or devices) of the type formed on an insulating base or those having a substrate which is not clamped to a potential sufficiently high to maintain the source-to-substrate diode reverse biased. The substrate floats and its associated capacitances (e.g. $C_{BD}$ and $C_{BG}$) load down the signal source connected to the source electrode. The problem becomes acute when the capacitances of many transistors are effectively connected in parallel as illustrated in FIG. 2.

FIG. 2 shows three of N identical memory cells of a column of a memory array formed on an insulating base such as sapphire. As detailed for cell 2 each cell includes a storage element 10 and a gating transistor (also referred to herein as a "pass" transistor) P3. The storage element includes two cross-coupled inverters 11 and 12. Inverter 11 includes transistors P1 and N1 and inverter 12 includes transistors P2 and N2. The sources of N1 and N2 are connected to a point of reference potential indicated as circuit ground and the sources of P1 and P2 are connected to a point of positive operating potential indicated as $V_{CC}$ volts. The drains of P1 and N1 are connected to each other and to the gates of P2 and N2 at node A which defines one input-output point of the storage element 10. In a similar manner the drains of P2 and N2 are connected to each other and to the gates of P1 and N1 at the other input-output point of the element 10. The conduction path of a transistor P3 is connected between node A of each cell and a bit line BL. To aid the visualization of the problem the parasitic elements associated with the "pass" transistor are detailed for transistor P3 of cell number 1.

Assume that: (1) cell #2 is storing a "1" (i.e. node A of cell #2 is "high") while all the other cells of the column are storing "0's" (i.e. each one of their respective node A is "low"), their transistor N1 being ON and clamping their respective node A to ground; (2) prior to the read-out of a selected cell, the bit line BL and its associated capacitance $C_{BL}$ are charged to zero volts; (3) A sense amplifier 20 connected at its input to bit line BL has a capacitive input and senses the voltage on the bit line. For the amplifier 201 to sense the "1" stored in a selected memory cell the bit line voltage must rise above $V_{CC}/2$; and (4) cell #2 is selected for read out by driving word line W2 to ground and thereby turning on P3 of cell #2. Concurrently, all the other word lines are held at $V_{CC}$ maintaining all their associated "pass" transistors turned off.

When P3 of cell #2 is turned on with the cell storing a "1," a current flows from $V_{CC}$ via P1 and P3 of cell #2 into BL. The pass transistors P3 of all the other cells of the column are turned off and their node A is at ground. However, as the bit line voltage rises above zero volts, the source-to-substrate diodes $D_{SB}$ of all the other cells conduct in the forward direction and effectively couple the capacitance associated with the floating substrate of each P3 transistor, to the bit line. The $C_{BD}$ and $C_{BG}$ capacitances of all the pass transistors are thus effectively connected in parallel and have to be charged up to, or close to, $V_{CC}$. The charging current can only come from transistor P1 of cell "2," which is, therefore, heavily loaded. The time to charge the bit line until it reaches a potential above $V_{CC}/2$ is dependent on the capacitance associated with the bit line, which capacitance is a function of the number of cells of the column storing a "0." Therefore, the capacitances associated with the floating substrates render the sensing of the memory pattern sensitive. That is, the read-out of a selected cell is affected by the pattern stored in other cells of the array. This problem is very significant in large memory arrays as all, none, or any intermediate number, of the cells of a column may by storing "0." This means that the size of the capacitance which must be charged before the threshold of the sense amplifier is reached can vary over a wide range and the time to read-out the contents of a selected cell correspondingly can vary over a wide range. In addition, for the worst case condition (all "0's" in the non-selected cells) the time needed to correctly read-out the contents of a memory cell may be too long, that is, the read period required will be longer than can be tolerated for high speed memory operation.

In circuits embodying the invention the source-to-substrate junctions of all the "pass" transistors are placed in a reverse biased and/or non-conductive condition prior to the read out of any cell, thereby substantially decreasing the loading effect of the capacitances associated with the floating substrates of the OFF transistors and the pattern sensitivity problem, described above.

In circuits embodying the invention, a precharge signal is applied to the source of an IGFET having a floating substrate. The precharge signal makes a first transition between first ($V_1$) and second ($V_2$) voltages in a direction to forward bias the source-to-substrate junction and a second transition of opposite polarity to the first transition. The first transition of the precharge pulse places the substrate at a first level which is offset from $V_2$ by the small forward voltage drop of the source-to-substrate junction. The second transition of the precharge pulse is in a direction to reverse bias the source-to-substrate junction and is of sufficient amplitude to place the substrate at a second level (L2) intermediate L1 and $V_1$. The source-to-substrate junction is then reverse biased for all values of input signals subsequently applied to the source of the IGFET in the range between $V_1$ and L2.

The circuit of FIG. 3 shows 3 memory cells (1, 2, . . . n) of an array of cells, each cell (i) including a storage element (10i) and a "pass" transistor (P3i) per cell coupling the output (node A) of each cell to a bit line BL. Parasitic elements associated with "pass" transistors P31 and P32 are detailed. This circuitry is similar to that shown in FIG. 2 and need not be detailed further. FIG. 3 also includes a precharge circuit 30 and a sense amplifier 201 connected to the bit line BL, and a word select circuit 32 connected to the word lines, $W_i$.

Figure 5:
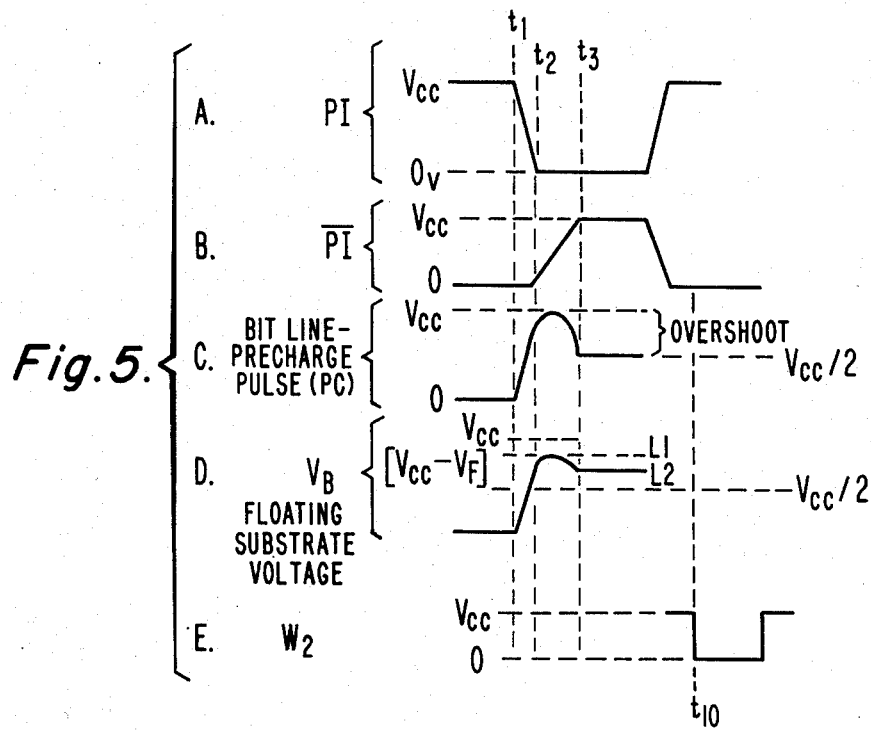
FIG. 5 is a diagram of waveforms associated with various nodes of the circuits of FIGS. 3 and 4.

The precharge circuit 30 produces a positive going precharge pulse (PC), of the type shown in waveform C of FIG. 5, which is applied to the bit line (BL) when the "pass" transistors are turned-off and prior to the turn-on of any one of them. The precharge pulse (PC) causes the floating substrates (nodes Bi) of the "pass" transistors to be charged to a sufficiently high voltage level such that the source-to-substrate diodes ($D_{SB}$) of the non-selected pass transistors are rendered non-conducting during a subsequent read cycle. The word select circuit 32 normally applies $V_{CC}$ volts to all the word lines during precharge and to the non-selected word lines during read (or write) to maintain the "pass" transistors of P-conductivity type whose gate electrodes are connected to those lines in the "off" condition. When a word line is selected for read (or write) the word select circuit 32 causes that word line voltage to go from $V_{CC}$ volts to zero volts for the duration of the read (or write) period.

Figure 4:
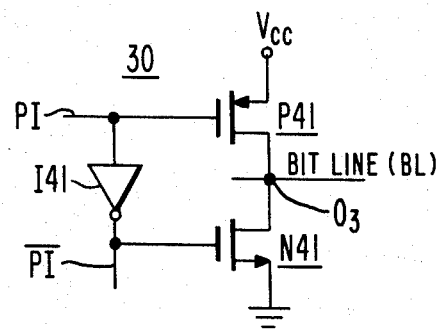
FIG. 4 is a schematic diagram of a precharge circuit for use with the RAM array of FIG. 3.

The precharge circuit of FIG. 4 functions to first precharge the bit line to, or close to, $V_{CC}$ volts, and the floating substrates close to $V_{CC}$ volts, and to then reduce the voltage on the bit line to approximately $V_{CC}/2$ volts, where $V_{CC}/2$ is assumed to be the midpoint between the high (logic 1) and low (logic 0) levels read out of the memory and the preferred point at which to bias the sense amplifier 201 connected to bit line BL.

Circuit 30 includes a transistor P41, of P-conductivity type, whose conduction path is connected between $V_{CC}$ and the circuit output $O_3$, which is connected to the bit line and a transistor N41, of N-conductivity type, whose conduction path is connected between $O_3$ and ground. A precharge initiate (PI) signal is applied to the gate of P41 and to the input of a highly skewed inverter I41 whose output ($\overline{PI}$) is applied to the gate of N41. The positive going output (from 0 to $V_{CC}$) of I41 is considerably delayed relative to its negative going ($V_{CC}$ to 0) input (PI) while its negative going output ($V_{CC}$ to 0) is not significantly delayed relative to the positive going input.

In response to the PI and $\overline{PI}$ pulses, of the type shown in waveforms A and B of FIG. 5, transistor P41 is turned-on, at time $t_1$, while transistor N41 is off. P41 then passes a current ($I_{PC}$) between $V_{CC}$ and the Bit Line charging the capacitance ($C_{BL}$) of the latter and the capacitances of the floating substrate of the "pass" transistors towards $V_{CC}$ as shown in waveforms C and D. As $\overline{PI}$ becomes more positive, between times $t_2$ and $t_3$, N41 begins to be turned on while P41 is still conducting. Assuming the impedances of the conduction paths of P41 and N41 to be equal (for equal values of turn on bias) the potential at the output of circuit 30 decreases from the $V_{CC}$ level reached at about time $t_2$ towards $V_{CC}/2$ at time $t_3$. At time $t_3$, the precharge circuit functions as a voltage divider whose output, $O_3$, goes to $V_{CC}/2$ volts, as shown in waveform C of FIG. 5. That is, the impedance of P41 is then equal to the impedance of N41 and $O_3$ is then at $V_{CC}/2$.

Beginning at time $t_1$, when PC goes from 0 volts to $V_{CC}$ volts, a portion of $I_{PC}$ flows along the bit line charging up its capacitance ($C_{BL}$) and portions of $I_{PC}$ flows via all the forward biased source-to-substrate diodes ($D_{SB}$) of the "pass" transistors connected to the bit lines charging up their $C_{BG}$ capacitances and their $C_{BD}$ capacitances, until the substrate region voltages ($V_B$) at each one of the "pass" transistors is at, or close to, $[V_{CC}-V_F]$ volts as shown in waveform D of FIG. 5; where $V_F$ is the forward voltage drop of a source-to-substrate diode ($D_{SB}$).

It will now be shown, with reference to FIG. 6, that whereas the bit line voltage decreases from $V_{CC}$ to $V_{CC}/2$ between times $t_2$ and $t_3$, the decrease in $V_B$ is substantially less than $V_{CC}/2$, whereby, at time $t_3$, $V_B$ is more positive than the bit line voltage ($V_{CC}/2$).

FIG. 6 is a simplified equivalent circuit of a turned off "pass" transistor P3i of the type shown in FIG. 3 for the condition when its associated memory cell is storing a zero voltage level signal (i.e. N1 is ON, P1 if OFF, and node A is at or close to ground). The signal source 30 corresponds to the precharge circuit 30, $Z_{N1}$ corresponds to the "ON" impedance of the conduction path of N1 connected between node A and ground, $Z_R$ corresponds to the source impedance of the word select circuit 32 applying $V_{CC}$ or ground to the word line ($W_i$) connected to the gate electrode of the "pass" transistor. As for FIGS. 1 and 2, $D_{SB}$ and $C_{SB}$ represent the source-to-substrate diode and capacitance, respectively; $D_{BD}$ and $C_{BD}$ represent the substrate-to-drain diode and capacitance, respectively, and $C_{BG}$ represents the substrate-to-gate capacitance of the pass transistor. It will also be assumed that $C_{BG}$ is 5 times greater than $C_{SB}$ or $C_{BD}$ and that $C_{BD}$ and $C_{SB}$ are equal to each other. The end of $C_{BG}$ connected to the gate electrode and thence to the word line is considered to be returned to AC ground via the $V_{CC}$ supply and node A is likewise returned to AC ground. (This is equivalent to assuming that $Z_{N1}$ and $Z_R$ are zero ohms). The sum of $C_{BG}$ plus $C_{BD}$ is then equal to $6C_{SB}$. For ease of discussion, it is assumed that the charging pulse PC has very sharp transitions; and that PC goes from 0 to $V_{CC}$ volts at time $t_1$ and remains at $V_{CC}$ until time $t_3$ when it decreases to $V_{CC}/2$. A PC pulse of $V_{CC}$ volts causes $C_{BL}$ to charge up to $V_{CC}$ and causes $V_B$ to go to $[V_{DD}-V_F]$ volts; $C_{SB}$ is essentially shunted by the forward conduction of $D_{SB}$.

At time $t_3$ the precharge signal goes from $V_{CC}$ to $V_{CC}/2$. The transition of the precharge pulse from $V_{CC}$ to $V_{CC}/2$ is equivalent to applying a negative step of $V_{CC}/2$ amplitude to the bit line. Since node B is at $[V_{CC}-V_F]$ volts, $D_{SB}$ and $D_{BD}$ are reversed biased and non-conducting when PC goes below $V_{CC}$. Hence, the negative step sees a capacitive divider circuit comprised of $C_{SB}$ in series with the parallel combination of $C_{BD}$ and $C_{BG}$ which are connected between node B and ground.

The decrease in potential at node B due to the negative ($V_{CC}$ to $V_{CC}/2$) transition of PC is calculated below. The change ($\Delta V_B$) in $V_B$ is equal to:

$$\Delta V_B = \frac{V_{CC}/2 \times C_{SB}}{C_{SB} + C_{DB} + C_{BG}}$$

For $C_{BG}=6C_{SB}=6C_{BD}$ $$\Delta V_B = V_{CC}/2 \times 1/7$$

$V_B$ at time $t_3$ is then equal to $V_B$ just prior to time $t_3$ minus the $\Delta V_B$ at time $t_3$;

$V_B = [V_{CC}-V_F] - V_{CC}/2 \times 1/7$ where, for example, $V_{CC}=5$ volts and $V_F=0.6$ volts.

$V_B$ just prior to time $t_3$ was equal to 4.4 volts and at time $t_3$ $V_B$ goes to:

$V_B = 4.4 - 2.5/7 \cong 4$ volts. $V_B$ is thus, significantly greater than $V_{CC}/2$ which is equal to 2.5 volts.

The significance of these results is that whereas the PC pulse which is equal to $V_{BL}$ is returned to 2.5 volts, $V_B$ is at approximately 4 volts. Clearly, diode $D_{SB}$ will be reverse biased for voltages subsequently applied to BL ranging between zero volts and 4 volts. Diode $D_{SB}$ thus isolates node B and the capacitance associated with the floating substrate from the signal source connected to the source region.

It should also be noted that diode $D_{SB}$ does not conduct until its $V_F$ is exceeded. That is, $D_{SB}$ does not conduct until $V_{BL}$ goes more positive than $V_B + V_F$ and until that value of voltage is reached the "pass" transistor does not load the signal source connected to the bit line.

It should also be noted that where it is desired and/or necessary to have the diodes $D_{SB}$ reverse biased for a wider range of input signals on the bit line, that the precharge pulse can then be made to have a forward biasing transition above $V_{CC}$, such that when the PC pulse makes a negative going transition (returns to its quiescent level), $V_B$ remains charged at $V_{CC}$ volts (or more).

The negative going transition of PC was assumed to range from $V_{CC}$ to $V_{CC}/2$. However, it should be noted that, even it the precharge pulse were to make a transition from $V_{CC}$ to zero volts at time $t_3$, $V_B$ would still be more positive than $V_{CC}/2$. For a negative step of $V_{CC}$ volts the change $\Delta V_B$ in $V_B$ would be equal to $V_{CC} \times 1/7$, and $V_B$ would be equal to $V_{CC} - V_F - V_{CC}/7$. Solving for $V_B$ shows that $V_B$ is still greater than $V_{CC}/2$. $V_B = V_{CC}[1 - 1/7] - V_F = V_{CC}(6/7) - V_F$. For $V_{CC}$ and $V_F$ equal to 5 volts and 0.6 volts, $V_B$ is approximately equal to 3.685 volts which is still significantly greater than 2.5 volts.

The effect of precharging the memory array of FIG. 3 and its subsequent operation may now be better understood.

First, assume that a precharge pulse PC has been applied to the bit line, as discussed above, which made a first transistor between 0 and $V_{CC}$ and a subsequent transition from $V_{CC}$ to $V_{CC}/2$. It may then be assumed that all nodes B of the pass transistors connected to the bit line are charged to the level L2, where L2 is assumed equal to 4.0 volts, and that the bit line is precharged to $V_{CC}/2$. Also, as noted above assume that the flip or switching point of the sense amplifer 201 is $V_{CC}/2$.

Assume further that cell 2 is storing a "1" (i.e. its P1 is ON, and its N1 is OFF) while all the other cells connected to the bit line are storing a "0."

Assume now that read-out of cell 2 is initiated at time $t_{10}$ by driving $W_2$ from $V_{DD}$ volts to zero volts. "Pass" transistor P32 is turned on and current flows from $V_{CC}$ via the conduction paths of P1 of cell 2 and P32 onto the bit line charging its capacitance $C_{BL}$ from $V_{CC}/2$ towards $V_{CC}$.

Since the floating substrates of all the non-selected "pass" transistors are charged to approximately 4 volts and since the $V_F$ of the source-to-substrate diodes is equal to 0.6 volts the source-to-substrate diodes of all the non-selected transistors are reverse biased until the voltage on the bit line reaches 4 volts. Furthermore, since the $V_F$ of these diodes is 0.6 volt, and $D_{SB}$ diodes will not conduct until the bit line voltage reaches 4.6 volts ($V_B + V_F$). Clearly, until $V_{BL}$ reached 4.6 volts, the cell being read-out sees the bit line capacitance $C_{BL}$ and only a small portion of the capacitances of the non-selected cells. All the capacitances associated with the floating substrates of the non-selected cells are decoupled and isolated from the bit line by means of reverse biased junctions. The reverse biased junctions do provide some capacitive coupling between the bit line and the substrate regions. But, capacitor $C_{SB}$ is relatively small and if heavily reverse biased is made even smaller. $C_{SB}$ of each non-selected cell is in series with the parallel combination of $C_{BG}$ and $C_{BD}$. Thus, for the numerical values assumed above, at most, only one-seventh (1/7th) of the capacitance otherwise present now loads the bit line and the read-out is much less pattern sensitive.

The memory cell output is, therefore, read-out very quickly, and the loading on the signal will be relatively constant. Therefore, the time constant for read-out will also be realtively constant and be virtually independent of the pattern present in the array.

Normally, the sense amplifier 201 is set to sense the contents of a memory cell when the voltage on the bit line exceeds $V_{CC}/2$ by a few millivolts (e.g. $\pm 50$ millivolts). Therefore, in the circuit of FIG. 3 the read-out time regardless of which cell is read will be highly consistent (uniform) because the loading will be similar during the respective read out period in that one cell is being accessed, and all of the remaining cells regardless of what they are storing, are isolated from the bit line by a non-conducting transmission gate. The speed of read out is high because the loading on the accessed cell by other cells is very low in view of the fact that the other cells are isolated (by the off "pass" transistor) and look like high values of impedance (and low values of capacitances). Consistency is obtained by virtue of the fact that the read out conditions are the same (regardless of whether the loading is low or high). The loading happens to be low and that is good because it means that the read out speed can be high. Clearly, the decreased loading also substantially decreases the pattern sensitivity problem.

In the above discussion, it was assumed that the precharge pulse drives the bit line to $V_{CC}$ and then back to $V_{CC}/2$. In many applications, it is not necessary to drive the bit line to $V_{CC}$. In fact, the precharge pulse may only have to drive the bit line close to, or about, $V_{CC}/2$ as discussed below.

First the sense amplifier 201 once precharged to its flip point ($V_{FP}$) will switch when its input changes by $\pm 50$ millivolts about $V_{FP}$. Secondly, diodes $D_{SB}$ do not conduct until their source potential is $V_F$ volts more positive than their substrate. Consequently, the sense amplifier can detect the contents of the cell being read-out where the $V_B$ of the non-selected "pass" transistors is set at $V_{FP} + 50$ millivolts $- V_F$. Where $V_{FP}$ is equal to $V_{CC}/2$ and $V_F$ is 600 millivolts it is evident that $V_B$ can even be set below $V_{CC}/2$ and that the diodes $D_{SB}$ of the non-selected transistors will not conduct and load the signal of the memory cell being read-out, prior to the read amplifier having detected the contents of the cell being read out.

In the above discussion it was assumed that the $V_{FP}$ of the sense amplifier 201 was $V_{CC}/2$. However, it is desirable in many instances to have the flip point of the sense amplifier set at a value, above or below, other than $V_{CC}/2$. The precharge $V_B$ level, in those instances, is then set so as not to load the signal being read-out prior to the flip point of the sense amplifier being reached.

It is significant that the precharge pulse by raising the substrate potential of a transistor increases its threshold voltage. It should be evident that in circuits embodying the invention the threshold voltage (turn on, turn off point) of the "pass" transistors is rendered much more uniform since the substrate potential of all the off transistors is set at nearly the same potential. The turn on and turn off point of the pass transistors is therefore better defined, more uniform, and more consistent from device to device.

With due care for the difference in polarity and conductivity the invention may be practiced as shown in FIG. 7 with "pass" transistors of complementary conductivity type to those shown in FIGS. 3 and 6.

In FIG. 7 one cell of an array is shown. The cell includes a storage element comprised of 2 cross coupled inverters and a pass transistor N1 of N-conductivity type whose conduction path is connected between the input-output (I/O) point of the storage element and the bit line (BL). The parasitic diodes of transistors N1 are poled in the opposite direction to those of the P "pass" transistors. The rest of the circuit is similar to that of FIG. 3 and need not be detailed.

For "pass" transistors of N conductivity type, a problem arises if: (a) one or more of the non-selected turned-off pass transistors have their substrates charged to a high level and/or their associated storage cells are storing a "1"; and (b) the selected transistor is storing a "0."

When the selected "0"-storing N-type transistor is turned-on, (by applying $+V_{CC}$ volts to its word line), the non-selected transistor substrate capacitances which are at or near logic "1" discharge via their forward biased substrate-to-source junctions onto the bit line and via the conduction path of the turned on transistor to ground. This makes read out problematic in that the bit lines does not quickly reach the level corresponding to the information stored in the selected cell and furthermore the cell contents may be upset due to the low $V_T$ of the devices whose substrate is at a potential close to the logic "1" level.

The parasitic currents flowing onto the bit line which is being pulled towards ground by the selected "0" storing transistors tend to hold the line high, thereby delaying the read out of the "0." Furthermore, the parasitic currents flow via the pass transistor into node A of the selected cell creating the possibility that the cell will be upset.

In the circuit of FIG. 7 the function of the precharge circuit 30a is to first discharge the substrate regions of the turned off transistors to, or close to, zero volts via the forward biased source-to-substrate junctions D1. The precharge circuit then raises the bit line voltage (e.g. towards $V_{CC}/2$) such that the source to substrate junctions (D1) of all the turned off transistors are reverse biased for signals applied to the bit line corresponding to a "0" being read out of the selected cell.

In FIG. 7 an inverter 171 which is "skewed" to delay its response to a positive going signal is connected between the gates of P41 and N41. Hence, in response to a positive going $PI_N$ pulse the bit line is first driven to zero volts and then towards $V_{CC}/2$ volts as shown in waveform 7D. Concurrently, assuming $V_B$ to be at $V_{CC}$ volts when the bit line is first driven towards zero, the substrate region discharges via diode D1 (the substrate-to-source diode of N1) into BL. Due to the forward diode drop ($V_F$) of D1 the substrate is held at $V_F$ volts above $V_{BL}$ establishing a first level (L1).

As the PC pulse applied to BL makes a positive going transition from 0 volts to $V_{CC}/2$ volts diode D1 is reverse biased and the substrate region is therefore isolated from the bit line by the reverse bias source-substrate junction (D1). Due to the capacitive divider action the substrate potential will move up towards $V_{CC}/2$. But, as before, the substrate-to-gate capacitance is significantly greater than the substrate-to-source capacitance and the upward change in $V_B$ is very slight. It is evident that once the substrate region is precharged to a second level (L2) that subsequent signals can be applied to the bit line ranging from $V_{CC}$ to L2 and that diode D1 will be reverse bias and or non-conducting, whereby the capacitances associated with the floating substrate do not load the signal source supplying the subsequent signals.

In the drawing a single precharge circuit 30 and 30a was used to illustrate the invention. But, it should be evident that many different types of precharge circuits could be used to perform the required function. Also it should be evident that many different sense circuits could be used to practice the invention.

What is claimed is:

1. In combination with an insulated-gate field-effect transistor (IGFET) having source and drain regions spaced apart by a substrate region, and wherein said source region forms a first rectifying junction with said substrate region and said drain region forms a second rectifying junction with said substrate region, said first and second junctions being poled to conduct current in opposite direction and wherein said substrate region is electrically floating, the improvement comprising:
   means for first applying to said source region a signal making a first transition from a first voltage ($V_1$) to a second voltage ($V_2$) of a polarity and magnitude to forward bias said source-to-substrate junction for placing said substrate region at a potential close to said second voltage and for then applying a signal making a second transition of a polarity opposite to said first transition for reverse biasing said source-to-substrate junction and isolating said substrate region from said source region.

2. In the combination as claimed in claim 1 wherein said second transition of said signal goes from said second voltage ($V_2$) to a third voltage ($V_3$), where $V_3$ is intermediate said first and second voltages; and
   wherein said improvement further comprises means for turning off said IGFET during the application of said signal.

3. In the combination as claimed in claim 1 wherein said potential close to said second voltage defines a first level (L1) which is equal to $V_2-V_F$, where $V_F$ is the forward voltage drop of said source-to-substrate region.

4. In the combination as claimed in claim 3, wherein in response to said second transition said substrate potential changes in value from said first level ($V_2-V_F$) to a second level intermediate the first level and $V_3$; and
   wherein said source-to-substrate junction remains reverse biased for all values of signal subsequently applied to said source region ranging in value between said first voltage to said second level L2.

5. In the combination as claimed in claim 1 wherein said IGFET is formed on an insulator layer; and
   wherein said IGFET includes a gate electrode isolated from and overlying said substrate region.

6. The combination comprising:
   a storage element having an input-output (I/O) point to which is applied data to be stored and from which is extracted data to be sensed;
   an insulated-gate field-effect transistor (IGFET) having source and drain regions separated by a substrate region, said source and drain regions forming respective junctions with said substrate poled to conduct in opposite directions and said substrate being electrically floating; said IGFET having a control electrode overlying said substrate region for the application thereto of turn-on and turn-off voltages;
   a bit line;
   means directly connecting one of said source and drain regions to said input/output point; and the other one of said source and drain regions to said bit line;

precharge means coupled to said bit line for selectively applying thereto a precharge pulse making a first transition between a first voltage and a second voltage of a polarity to forward bias said source-to-substrate region and placing said substrate region at a potential level close to said second voltage and said precharge pulse making a subsequent transition of opposite polarity to said first transition; and means coupled to said control electrode for applying a turn-off voltage to said control electrode during the application of said precharge pulse.

7. The combination as claimed in claim 6 wherein said source, drain and substrate regions of said IGFET are formed on a layer of insulating material.

8. The combination as claimed in claim 7 wherein said subsequent transition of opposite polarity goes from said second level to a third level intermediate said first and second levels; and wherein said source-to-substrate region is reverse biased when said signal makes a subsequent transition.

9. In a memory system which has a common bit line, a plurality of memory cells each connected to the bit line by a gating transistor where each gating transistor includes source, drain, and substrate regions and a gate electrode, with capacitance ($C_{SB}$) between the source and substrate regions, capacitance ($C_{BD}$) between the substrate and drain regions, capacitance ($C_{BG}$) between the substrate and gate electrode, a diode ($D_{SB}$) between the source and substrate regions, and a diode ($D_{BD}$) between the substrate and drain regions, and where when it is desired to read the contents of a memory cell its associated gating transistor is turned-on and all the other gating transistors are turned off and the time required for current from the selected cell to pass through the turned-on gating transistor to charge the bit line to a desired threshold level indicative of the value of the information stored in the selected cell is affected by the charge stored in the capacitances of the turned-off gating transistors, an improvement for reducing the effect of the capacitance of the non-selected cells on the read out time of the selected cell comprising:

means for selectively turning off all the gating transistors; and means for then, prior to the turn-on of any one of said gating transistors, applying a precharge pulse to said common bit line of a polarity to forward bias the source-to-substrate region of all said gating transistors and placing the substrates at a predetermined level whereby the source-to-substrate junctions of all the turned-off gating transistors will be reverse biased for all signals applied to said common bit line having a polarity to forward bias said source-to-substrate region in a range extending to said predetermined level.

* * * * *

UNITED STATES PATENT AND TRADEMARK OFFICE
CERTIFICATE OF CORRECTION

PATENT NO. : 4,281,400

DATED : July 28, 1981

INVENTOR(S): Henry Isaac Schanzer et al.

It is certified that error appears in the above-identified patent and that said Letters Patent is hereby corrected as shown below:

Col. 3, line 26 "11 and 12." should be --- I1 and I2. ---.
       line 27 "11" should be --- I1 ---.
       line 28 "12" should be --- I2 ---.
       line 50 "20" should be --- 201 ---.

Col. 9, line 45 "171" should be --- I71 ---.

Signed and Sealed this

Fifteenth Day of December 1981

[SEAL]

Attest:

GERALD J. MOSSINGHOFF

Attesting Officer     Commissioner of Patents and Trademarks